United States Patent

[11] 3,566,218

[72] Inventors Robert J. Widlar
Mountain View;
David V. Talbert, Santa Cruz, Calif.
[21] Appl. No. 764,403
[22] Filed Oct. 2, 1968
[45] Patented Feb. 23, 1971
[73] Assignee National Semiconductor Corporation, Santa Clara, Calif.

[54] MULTIPLE BASE WIDTH INTEGRATED CIRCUIT
4 Claims, 6 Drawing Figs.

[52] U.S. Cl. .......... 317/235, 317/234, 307/254, 148/186, 307/294
[51] Int. Cl. .......... H01l 19/00
[50] Field of Search .......... 317/235, 22, 22.1, 401; 307/254, 296

[56] References Cited
UNITED STATES PATENTS

| | | | |
|---|---|---|---|
| 3,449,682 | 6/1969 | Miwa et al. .......... | 330/20 |
| 3,335,341 | 8/1967 | Lin .......... | 317/235 |

*Primary Examiner*—John W. Huckert
*Assistant Examiner*—B. Estrin
*Attorneys*—Harvey G. Lowhurst and Claude A. S. Hamrick

ABSTRACT: A novel high-performance monolithic integrated circuit means including semiconductive transistor elements having different base widths so that one or more of the transistors have a high voltage breakdown characteristic, while one or more of the remaining transistors have a high current gain characteristic. This is accomplished by diffusing certain regions of selected ones of the respective transistors for longer periods of time than like regions of the other transistors so as to render the base widths of certain ones of the transistors of lesser thickness than those of the remaining transistors.

INVENTORS
ROBERT J. WIDLAR
DAVID V. TALBERT
BY Harvey J. Lambert
ATTORNEY

MULTIPLE BASE WIDTH INTEGRATED CIRCUIT

BACKGROUND OF THE INVENTION

One of the principal disadvantages encountered in high-performance monolithic linear integrated circuits is that the gain characteristics and voltage handling capabilities of the respective bipolar semiconductive elements of the same type comprising the composite structure are usually more or less uniform throughout. This is a natural consequence of the manner in which such circuits are typically manufactured.

By using the familiar planar process, for example, the circuit elements are formed by the multistaged diffusion of certain impurities into a silicon substrate. This process typically consists of bringing a high concentration of dopant atoms into contact with the surface of the silicon slice so that, under the influence of heat, the dopant penetrates into the slice in areas delimited by a masking apparatus of a predetermined configuration. Since the dopant is actually caused to migrate into the crystalline structure of the substrate, the depth of the penetration and the concentration of the dopant within the slice depends on time, temperature, and the particular type of dopant used, as well as its original concentration.

In the typical multiply diffused semiconductor, the same region of the slice is diffused into, two or more times, in order to produce the areas of one type of impurity separated by another type of impurity which form the requisite PN junctions and, because of the manner in which the dopant is caused to penetrate into the substrate, each time the slice is exposed to high temperature the previously diffused dopant continues to diffuse further into the substrate. The result is that with each subsequent diffusion the physical characteristics of the previously diffused areas are changed.

The reason why it is desirable to have several transistors of differing electrical characteristics on the same chip is that the several transistors can then be combined in a circuit configuration that takes advantage of the best quality of the respective transistors, thus producing circuits superior, for certain applications, to those circuits using a plurality of similar transistors. One of the problems encountered in making monolithic integrated circuits of this type is in meeting the requirement that the circuit have both high current gain and high voltage capability. While high current gain ($\beta$) is normally a function of the base width of a particular transistor element, i.e., $\beta$ is increased as the width of the base is decreased, and the base width is determined by diffusion time at a given temperature, the voltage handling capacity of a given transistor element is usually decreased as the base width is decreased. Thus, the very process by which the higher gain characteristic is obtained tends to degrade the voltage breakdown characteristic. It would therefore appear to be very difficult indeed to produce on a single chip an integrated circuit composed of bipolar transistor elements which would as a whole have both the capabilities of high current gain and high voltage handling capability.

Heretofore proposed solutions, such as the use of higher resistivity collector material, have been tried in an effort to overcome this manufacturing problem. However, these solutions have resulted in such disadvantages as a reduction of current handling capability, an increase in saturation resistance, reliability problems, and various other manufacturing difficulties.

SUMMARY OF THE INVENTION

This invention therefore relates to a process wherein integrated circuit elements are provided on the same chip which have differing base widths so as to enable the elements to be combined in an integrated circuit such that the circuit as a whole exhibits the previously unavailable characteristics of high current gain as well as high voltage handling ability.

It has been found that by the addition of one extra processing step to the familiar double diffusion process two species of the same type of transistor can be made on the same chip; one having moderate current gain and high breakdown voltage, and the other having very high current gain and lower breakdown voltage. This can be accomplished by using the extra processing step to render the base widths of the two species of transistors dimensionally different.

In the manufacture of the usual type of integrated circuits by the double diffusion method, the substrate is initially doped with, for example, an N-type material which will provide the collector region for each of the transistors to be formed thereafter in the chip. All of the P-type base regions are then diffused into the chip during the first diffusion, and subsequently the N-type emitter regions are diffused into the previously formed base regions.

But in accordance with the method of the present invention, after the base regions are formed during the first diffusion, only selected ones of the base regions are exposed to the dopant during the second diffusion process. This allows the selected emitter regions to diffuse into certain ones of the base regions a predetermined distance below the surface of the wafer. Then, during the following "extra" diffusion step, the remaining base areas are exposed to the dopant, and the remaining emitter regions are formed. However, during the third diffusion, the emitter regions formed during the second step continue to diffuse into the base regions, thus decreasing the thickness of the base material separating the emitters from the collectors. Therefore, following the third diffusion step, two species of transistors are embodied in each chip, one having a much thinner base width than the other, with the result being that the transistors of the one specie have better current gain characteristics, while, those of the other specie, having a higher voltage breakdown characteristic.

OBJECTS OF THE INVENTION

It is therefore a principal object of the present invention to provide a novel method for the manufacture of high-performance monolithic linear integrated circuits which have both high current gain and high voltage characteristics.

Another object of the present invention is to provide a high-performance monolithic linear integrated circuit which includes a plurality of semiconductor elements having different physical characteristics and which are interconnected so as to produce a circuit having both high current gain and high voltage characteristics.

Still another object of the present invention is to provide a method by which an integrated circuit can be manufactured having at least one input transistor with a high current gain which sees a low collector-to-base voltage and at least one load handling output transistor with a high voltage handling capability.

Still another object of the present invention is to provide an integrated circuit having two species of the same type of transistors formed on the same chip; one having moderate current gain and high breakdown voltage, and the other having very high current gain and lower breakdown voltage.

These and other objects of the present invention will become more readily apparent after a reading of the following specification which, when considered along with the drawing, constitutes a disclosure of preferred methods and embodiments in accordance with the present invention.

Figure 1:
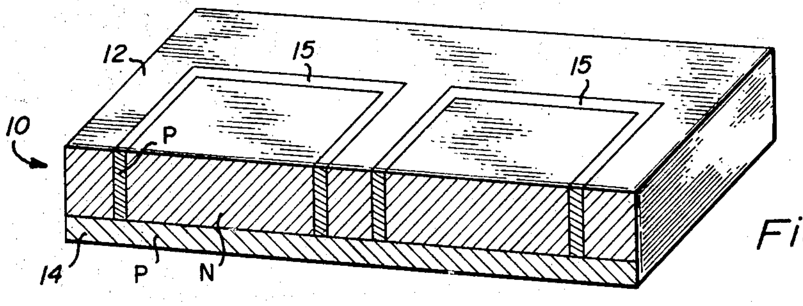
FIG. 1 is a sectional illustration of the chip of a prepared substrate.

It should be noted that the dimensions of the drawing are greatly exaggerated so as to insure clarity of the illustration. Furthermore, the drawings are to be interpreted in light of the descriptive material which follows in the specification.

DESCRIPTION OF THE PREFERRED EMBODIMENT

Referring now to the drawing, there is shown in FIG. 1 a prepared chip, or wafer, of substrate 10 which serves as a starting material for the practice of the invention. The substrate 10 is of a silicon or other suitable semiconductor material, and is comprised of an upper layer 12 doped with one type of impurity, and a lower layer 14 doped with another type of impurity. As an example, the layer 12 might be an N-type film of silicon a few microns thick which has been epitaxially grown upon the P-type silicon layer 14. The wafer 10 is of a thickness sufficient to provide mechanical stability to the structure. In addition, rectangular rings 15 have been diffused through the layer 12 to isolate respective portions of the substrate. This is, of course, only one of the many alternative methods which might be used to provide electrical isolation of the various semiconductor elements which are to be subsequently formed in the chip.

Figure 2:
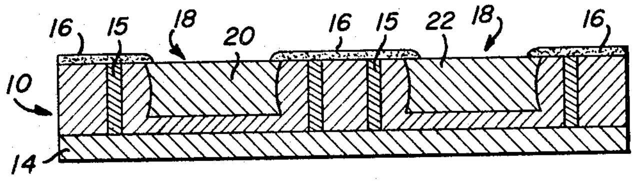
FIGS. 2 through 4 are side views, taken in cross section of a semiconductor structure in accordance with the present invention illustrating the various stages of the novel manufacturing process.

FIG. 2 shows the structure after an oxide diffusion mask 16 having openings 18 has been grown on the surface 12 of the chip 10, and the P-type base regions 20 and 22 have been diffused into the substrate 10 through the mask 12. Any of the known techniques for the formation of an oxide diffusion mask on silicon may be employed. One such technique is to thermally oxidize the surface 12 forming the silicon dioxide layer 16, and then to selectively remove certain portions thereof by photoresist masking and etching methods so as to provide the openings, or windows, 18.

After the oxide mask 16 is formed, the wafer is subjected to an acceptor type diffusant such as boron which has the property of slow diffusion through silicon dioxide, but rapid diffusion through silicon. This characteristic of boron makes possible the oxide masking process which allows the dopant to penetrate only into those areas of layer 12 left exposed by the mask 16. After the wafer has been exposed to the diffusant at a certain temperature for a predetermined period of time, the P-type regions 20 and 22 are formed in the N-type layer 12. Techniques for this type of impurity diffusion are well known and need not be herein described in detail.

Figure 3:
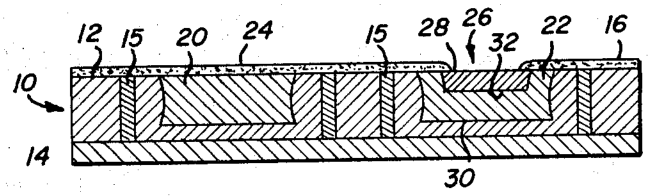

Whereas the next step in the prior art method is to grow an oxide over the entire upper surface of layer 12, and then photolithographically expose small areas of the surface of each P-type region, the present method requires that a small surface area in only one of the P-type regions 20 or 22 be exposed to the diffusant during the next diffusion step. This is illustrated in FIG. 3 wherein it is shown that an oxide 24 has been grown over the surface 12 of the wafer 10 entirely covering the P-type region 20. Only the area 26 is etched away to expose a portion of the surface of the P-type region 22 to the subsequently applied diffusant.

After the oxide mask 24 has been formed, the wafer is again subjected to a diffusant, but this time the impurity is of a donor type, such as phosphorous, so as to form an N-type region 28 in the P-type region 22. The time and temperature of the diffusion process are chosen such that the N-type impurity will penetrate only a predetermined depth into the P-type region 18. At the end of this diffusion stage a pair of NP junctions 30 and 32 have been formed which, if properly biased, might produce a transistor having a moderate current gain but a high breakdown voltage due to the relative thickness of the P-type base region 18 separating the emitter region 24 from the collector region 26.

Figure 4:
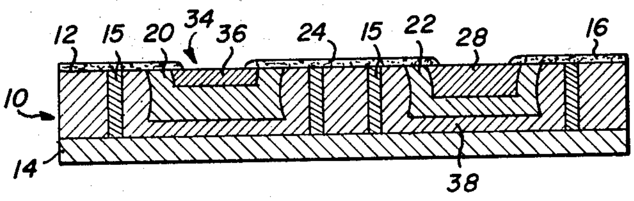

If now, as illustrated in FIG. 4, the area 34 is also etched out of the oxide layer 24 so as to expose the P-type region 20 to a subsequent N-type diffusion, an N-type region 36 will be formed in region 20 just as the N-type region 28 was formed in the region 22 during the preceding diffusion. However, it should be noted that since the depth of penetration of an impurity into the wafer is directly related to the length of time during which the wafer is subjected to the conditions of the diffusion process, the region 28, which is still exposed to the diffusant through opening 26, will continue to penetrate deeper into the substrate 12, thereby decreasing the thickness of the base region 22. The effect of the third diffusion step as described is to cause the base width (P-type region 22) of the transistor formed at the right-hand side of the FIG. to be substantially greater than the base width of the transistor on the left.

As mentioned previously, by decreasing the thickness of the base 22 separating the emitter and collector regions 28 and 38 respectively, the current gain characteristics of the transistor are improved at the expense of the breakdown voltage. Thus, by preselecting the diffusion parameters so as to produce a base width 20 which is capable of handling a given voltage, the current gain characteristics of the other transistor with thinner base 18 are simultaneously improved even though its breakdown voltage is reduced in value. The result then, is that using this novel plural diffusion process, a monolithic structure can be formed which includes at least two species of the same type of semiconductor elements one of which has a superior current gain, and the other of which has a greater breakdown voltage. By suitably interconnecting these elements so as to take advantage of the beneficial characteristics of both, it is possible to form a monolithic circuit which uses advantageously the best features of both species.

Figure 5:
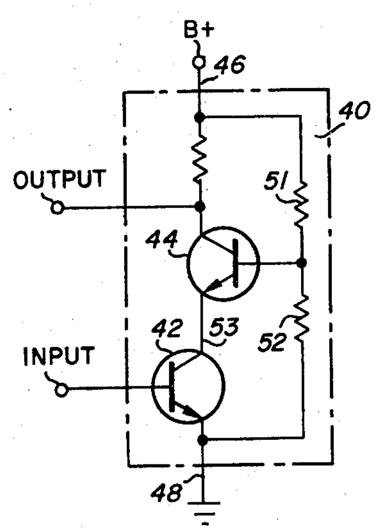
FIG. 5 illustrates a simple integrated circuit embodying the two types of transistors made on a single wafer in accordance with the present invention.

In FIG. 5 an exemplary circuit is shown in the form of a cascode amplifier circuit which is formed on a single wafer 40 in accordance with the present invention. The circuit includes a first transistor 42 having a narrow base as shown at 22 in FIG. 4 and a second transistor 44 having a substantially wider base width as shown at 20 in FIG. 4. As previously explained, the narrow base transistor 42 has a high current gain but a low breakdown voltage. On the other hand, the wide base transistor 44 has a moderate current gain but a high breakdown voltage. By combining the two transistors in the cascode manner shown, the circuit has the high $\beta$ characteristic of the transistor 42 and the high voltage capability provided by transistor 44.

Figure 6:
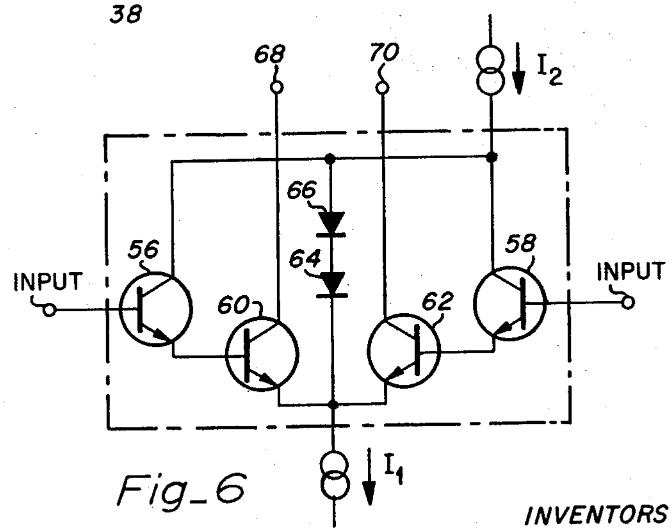
FIG. 6 illustrates an operational amplifier input stage made on a single wafer in accordance with the present invention.

In FIG. 6 another multiple transistor integrated circuit is illustrated which can be formed on a single wafer 54 using the method of the present invention. The illustrated circuit comprises a differential input stage for an operational amplifier, or the like, using low-voltage, high-gain input transistors 56 and 58, and high-voltage breakdown output transistors 60 and 62. The input transistors 56 and 58 have their collectors "bootstrapped" to the emitters of the output transistors 60 and 62 through the diodes 64 and 66. Hence, the collector-to-base voltages on the transistors 56 and 58 will always be near zero volts.

The output transistors 60 and 62, because of their high voltage handling capabilities, are connected to the load at output terminals 68 and 70 and can experience a substantial collector-to-base voltage. Accordingly, using this particular circuit, very high effective current gains can be realized along with high breakdown voltages by virtue of the two different species of transistors which are obtainable through the use of the process of manufacture of the present invention.

Since the input transistors 56 and 58 can be diffused to very low breakdown voltages, current gains of about an order of magnitude higher than presently used transistors can be achieved. Further, the current gain remains high at lower collector currents, when compared to presently used transistors, so the operating collector current can be reduced. This could give about a two order of magnitude improvement in input current over presently available monolithic operational amplifiers.

As indicated in FIG. 6, it should be noted that the present invention is not limited to a two transistor embodiment. The process is equally applicable to the production of chips having a multiplicity of individual circuit elements. Furthermore, the process can likewise be extended to include further diffusion steps to produce a number of species of transistors of which each specie has a slightly greater base width than another.

Likewise, the process includes the staged diffusion of the base regions instead of or in addition to the disclosed staged diffusion of the emitter regions in order to reduce the base width of certain ones of the transistors on a given chip.

The various types of monolithic circuits which are made possible by the present invention represent a significant advance to the state of the art, and are competitive with FET-input amplifiers for use in applications requiring a wide temperature range of operation. Further, circuits made in accordance with the present invention would render it far less expensive to obtain features such as low offset voltage and low offset voltage drift since this can at present only be accomplished by using carefully matched FET's having elaborate compensation schemes.

While many other advantages will be apparent to those of skill in the art, the above are set forth as representative of the many types of integrated circuits which are made possible by the present invention. It is recognized that certain alterations and modifications can readily be made to the methods and apparatus disclosed without departing from the actual merits of the inventive process, and it is therefore to be understood that the particular descriptions preceding are for purposes of illustration only and are not intended to be limiting in any way. Furthermore, we intend that the appended claims be interpreted as covering all modifications which fall within the true spirit and scope of our invention.

We claim:

1. A monolithic integrated circuit comprising:

a body of semiconductive material;

first transistor means formed in said body and including a first collector region of a first conductivity type, a first base region of a second conductivity type formed in said first collector region and defining a first PN junction therebetween, and a first emitter region of said first conductivity type formed in said first base region and defining a second PN junction therebetween, said first transistor means having a first base width defined by the separation between said first and second PN junctions;

second transistor means formed in said body and including a second collector region of said first conductivity type, a second base region of said second conductivity type formed in said second collector region and defining a third PN junction therebetween having a junction depth substantially equal to the junction depth of said first PN junction, and a second emitter region of said first conductivity type formed in said second base region and defining a fourth PN junction therebetween, said second transistor means having a second base width defined by the separation between said third and fourth PN junctions, said second base width being substantially larger than said first base width so that second transistor means has a substantially higher breakdown potential than said first transistor means; and conductor means interconnecting said first and second transistor means whereby said first transistor means forms an input stage for said integrated circuit and said second transistor means provides voltage overload protection for said first transistor means.

2. A monolithic integrated circuit comprising:

a body of semiconductive material;

first transistor means formed in said body and including a first collector region of a first conductivity type, a first base region of a second conductivity type formed in said first collector region and defining a first PN junction therebetween, and a first emitter region of said first conductivity type formed in said first base region and defining a second PN junction therebetween, said first transistor means having a first base width defined by the separation between said first and second PN junctions;

second transistor means formed in said body and including a second collector region of said first conductivity type, a second base region of said second conductivity type formed in said second collector region and defining a third PN junction therebetween having a junction depth substantially equal to the junction depth of said first PN junction, and a second emitter region of said first conductivity type formed in said second base region and defining a fourth PN junction therebetween, said second transistor means having a second base width defined by the separation between said third and fourth PN junctions, said first base width being substantially smaller than said second base width so that said first transistor means has a substantially higher current gain characteristic than said second transistor means; and conductor means interconnecting said first and second transistor means whereby said first transistor means forms an input stage for said integrated circuit and said second transistor means provides voltage overload protection for said first transistor means.

3. A monolithic integrated circuit comprising:

a body of semiconductive material;

first transistor means formed in said body and including a first collector region of a first conductivity type, a first base region of a second conductivity type formed in said first collector region and defining a first PN junction therebetween, and a first emitter region of said first conductivity type formed in said first base region and defining a second PN junction therebetween, said first transistor means having a first base width defined by the separation between said first and second PN junctions;

second transistor means formed in said body and including a second collector region of said first conductivity type, a second base region of said second conductivity type formed in said second collector region and defining a third PN junction therebetween, and a second emitter region of said first conductivity type formed in said second base region and defining a fourth PN junction therebetween having a junction depth substantially equal to the junction depth of said second PN junction, said second transistor means having a second base width defined by the separation of said third and fourth PN junctions, said second base width being substantially larger than said first base width so that said second transistor means has a substantially higher breakdown potential than said first transistor means; and Conductor means interconnecting said first and second transistor means whereby said first transistor means forms an input stage for said integrated circuit and said second transistor means provides voltage overload protection for said first transistor means.

4. A monolithic integrated circuit comprising a body of semiconductive material:

first transistor means formed in said body and including a first collector region of a first conductivity type, a first base region of a second conductivity type formed in said first collector region and defining a first PN junction therebetween, and a first emitter region of said first conductivity type formed in said first base region and defining a second PN junction therebetween, said first transistor means having a first base width defined by the separation between said first and second PN junctions;

second transistor means formed in said body and including a second collector region of said first conductivity type, a second base region of said second conductivity type formed in said second collector region and defining a third PN junction therebetween, and a second emitter region of said first conductivity type formed in said second base region and defining a fourth PN junction therebetween having a junction depth substantially equal to the junction depth of said second PN junction, said second transistor means having a second base width defined by the separation between said third and fourth PN junctions, said first base width being substantially smaller than said second base width so that said first transistor means has a substantially higher current gain characteristic than said second transistor means; and conductor means interconnecting said first and second transistor means whereby said first transistor means forms an input stage for said integrated circuit and said second transistor means provides voltage overload protection for said first transistor means.